US010866270B2

(12) United States Patent
Hole et al.

(10) Patent No.: US 10,866,270 B2
(45) Date of Patent: Dec. 15, 2020

(54) METHOD AND SYSTEM FOR DETECTING PEOPLE ON THE GROUND

(71) Applicant: BOSTIK SA, La Plaine Saint Denis (FR)

(72) Inventors: Stéphane Hole, Paris (FR); Yacine Oussar, Paris (FR); Julien Haffner, Champs sur Marne (FR)

(73) Assignee: BOSTIK SA, Colombes (FR)

( * ) Notice: Subject to any disclaimer, the term of this patent is extended or adjusted under 35 U.S.C. 154(b) by 89 days.

(21) Appl. No.: 16/307,949

(22) PCT Filed: Jun. 2, 2017

(86) PCT No.: PCT/FR2017/051401
§ 371 (c)(1),
(2) Date: Dec. 7, 2018

(87) PCT Pub. No.: WO2017/212153
PCT Pub. Date: Dec. 14, 2017

(65) Prior Publication Data
US 2019/0310297 A1 Oct. 10, 2019

(30) Foreign Application Priority Data

Jun. 7, 2016 (FR) .................................. 16 55207

(51) Int. Cl.
*G01R 27/26* (2006.01)
*G01R 15/00* (2006.01)
(Continued)

(52) U.S. Cl.
CPC ......... *G01R 27/2605* (2013.01); *G01R 15/00* (2013.01); *G01R 19/0046* (2013.01); *G08B 21/043* (2013.01); *G08B 21/0438* (2013.01)

(58) Field of Classification Search
CPC ................... G01R 27/2605; G01R 19/0046; G01R 15/00; G08B 21/043; G08B 21/0438
See application file for complete search history.

(56) References Cited

U.S. PATENT DOCUMENTS 4,827,763 A * 5/1989 Bourland ............... A61B 5/113
361/283.1
7,567,200 B1 * 7/2009 Osterweil ............ A61B 5/1117
342/28
(Continued)

FOREIGN PATENT DOCUMENTS

FR   2 956 137 A1   8/2011
WO  2014/053719 A1  4/2014

OTHER PUBLICATIONS

International Search Report, dated Sep. 25, 2017, from corresponding PCT/FR2017/051401 application.

*Primary Examiner* — Akm Zakaria
(74) *Attorney, Agent, or Firm* — Nixon & Vanderhye

(57) ABSTRACT

In a method for detecting people on a floor, at least three electrodes are integrated into the floor of the room that is to be monitored. Respective measurement axes are taken into account and associated with multiple pairs of electrodes integrated into the floor. The detection method includes the following steps: for each pair of electrodes, measuring a capacitance between the two electrodes of the pair; positioning a measurement point in a coordinate system defined by N of the measurement axes at coordinates provided by the capacitances measured for the pairs of electrodes respectively associated with the N measurement axes, where N is a number greater than 1; and detecting whether a person is lying on the floor according to a detection criterion that is function of the position of the measurement point in the coordinate system.

19 Claims, 8 Drawing Sheets

(51) Int. Cl.
    *G01R 19/00*     (2006.01)
    *G08B 21/04*     (2006.01)

(56) References Cited

U.S. PATENT DOCUMENTS

| | | | |
|---|---|---|---|
| 10,229,491 B1 * | 3/2019 | Rush | G06T 7/0012 |
| 2005/0167588 A1 * | 8/2005 | Donnangelo | A61B 5/0536 |
| | | | 250/307 |
| 2006/0161236 A1 * | 7/2006 | King | A61N 1/0553 |
| | | | 607/117 |
| 2015/0276963 A1 | 10/2015 | Casimiro et al. | |

* cited by examiner

METHOD AND SYSTEM FOR DETECTING PEOPLE ON THE GROUND

The present invention relates to the detection of people falling or lying on a floor instrumented with one or more capacitive sensors.

BACKGROUND

The invention applies in particular to buildings dedicated to the elderly, possibly of medical purpose, for example such as retirement homes. Other applications can also be envisaged, for example in the field of security (in museums, individual houses, public spaces, etc.).

A capacitive sensor has a number of electrodes. The measurement often relates to the amount of electric charge present on one or the other of the electrodes subjected to a voltage, the capacitance being the ratio of the amount of charge to the voltage. A complex impedance measurement, with a sinusoidal voltage, is also possible. The measured capacitance provides information on the electrical environment of the electrodes. In particular, when an additional electrode comes close to the sensor, the dielectric coupling changes, which causes the measured capacitance to vary.

The additional electrode in question may in particular be formed by the body of a person on the floor, as bodies are generally sufficiently electrically conductive. WO 2014/053719 A1 describes an example of a capacitive sensor suitable for detecting the presence of an object and/or an individual on the floor, comprising a set of elongate electrodes integrated into the floor structure.

The capacitive coupling between a person's body and the earth and the other electrodes of the sensor depends, among other things, on the posture of the person. To detect a person's fall onto the floor effectively, it is necessary to distinguish, in the capacitance measurements, between the "normal" cases (people standing, objects that are stationary or moving across the floor, etc.) and the cases of people who are lying down, justifying an alert. The raw data from the capacitive sensor(s) do not give precise information directly enabling this distinction.

An object of the present invention is to provide processing for obtaining a relatively reliable detection of the fall of a person onto the floor, based on capacitive measurements at electrodes integrated into the floor.

SUMMARY

A method is provided for detecting people on the floor, wherein at least three electrodes are integrated into the floor. Respective measurement axes are associated with multiple pairs of electrodes integrated into the floor. The method comprises the following steps:
  for each pair of electrodes, measuring a capacitance between the two electrodes of the pair;
  positioning a measurement point in a coordinate system defined by N of the measurement axes at coordinates provided by the capacitances measured for the pairs of electrodes respectively associated with said N measurement axes, where N is a number greater than 1; and
  detecting whether a person is lying on the floor according to a detection criterion that is function of the position of the measurement point in the coordinate system.

According to one possible arrangement of the electrodes, for a first of the N measurement axes, the electrodes of the associated pair are substantially parallel and with a first spacing between them, and for a second of the N measurement axes, the electrodes of the associated pair are substantially parallel and with a second spacing between them. The electrodes of the pairs associated with the first and second measurement axes are preferably located in the same horizontal plane. The second spacing may be at least three times larger than the first spacing. For example, the first spacing is comprised between 3 and 8 centimeters, while the second spacing is comprised between 15 and 30 centimeters.

In one embodiment of the method, a plurality of measurement points are positioned in a plurality of respective coordinate systems defined by different measurement axes at coordinates provided by the capacitances measured for the pairs of electrodes respectively associated with the different measurement axes. To detect whether a person is lying on the floor, several detection criteria are involved which are function of the positions of the measurement points in the respective coordinate systems. One of the coordinate systems may optionally be defined by measurement axes including at least one measurement axis associated with a pair of electrodes consisting of the same electrode twice.

According to another characteristic of the method, a preliminary measurement is made, for each measurement axis while the floor is unoccupied, of a reference capacitance between the two electrodes of the pair associated with said measurement axis. The measurement point positioned in a coordinate system is then given a coordinate, along a measurement axis, provided by a difference between the measured capacitance for the pair of electrodes associated with this measurement axis and the reference capacitance previously measured for this measurement axis.

It is possible to normalize the differences in capacitance in order to provide the coordinates of the measurement points in a coordinate system. The difference for each measurement axis is typically normalized relative to the reference capacitance previously measured for one of the N measurement axes. This can consist of dividing the capacitance measurements by the square of the reference capacitance measurement previously measured for this measurement axis, in order to obtain the coordinates of the measurement points in the coordinate system.

Some embodiments of the method comprise the determination of a non-alert region in the coordinate system defined by the N measurement axes. This region contains the measurement points observed when no one is lying on the floor. The detection criterion then comprises an evaluation of the position of a current measurement point relative to the non-alert region that has been determined.

The non-alert region can be determined by means of a learning process carried out after integration of the electrodes into the floor, making it possible to estimate the contour of the region within the coordinate system concerned. The learning process comprises, for example, the addition to the non-alert region of measurement points for which the smallest distance to the measurement points previously added to the non-alert region does not exceed α times the average distance between the measurement points previously added to the non-alert region (for example, α=3).

According to another characteristic, the positioning of the measurement point in the coordinate system defined by N measurement axes comprises determining a first measurement point and then applying a mathematical transformation to the first measurement point. This mathematical transformation is chosen so as to move the non-alert region defined for a room containing the floor where the electrodes are integrated, to a non-alert region defined for a reference room.

The mathematical transformation may in particular comprise a homothety and/or a rotation. In this case, the method comprises a preliminary measurement, for each measurement axis while the floor is unoccupied, of a reference capacitance between the two electrodes of the pair associated with said measurement axis, and the homothety and/or rotation is applied to the first measurement point having, along each measurement axis, a coordinate provided by a difference between the measured capacitance for the pair of electrodes associated with said measurement axis and the reference capacitance measured for said measurement axis.

The mathematical transformation can be determined from measurements made in the reference room and in the room containing the floor where the electrodes are integrated, using a calibration object placed on the floor.

Another aspect of the invention relates to a system for detecting people on the floor, comprising at least three electrodes integrated into the floor, a unit for powering the electrodes and measuring the capacitance between the electrodes, and a computer for controlling the power and measurement unit and detecting whether a person is lying on the floor. The computer is configured to execute the steps of a method as defined above.

BRIEF DESCRIPTION OF THE DRAWINGS

Other features and advantages of the invention will be apparent from the following description of some non-limiting exemplary embodiments, with reference to the appended drawings, in which.

DESCRIPTION OF EMBODIMENTS

Figure 1:
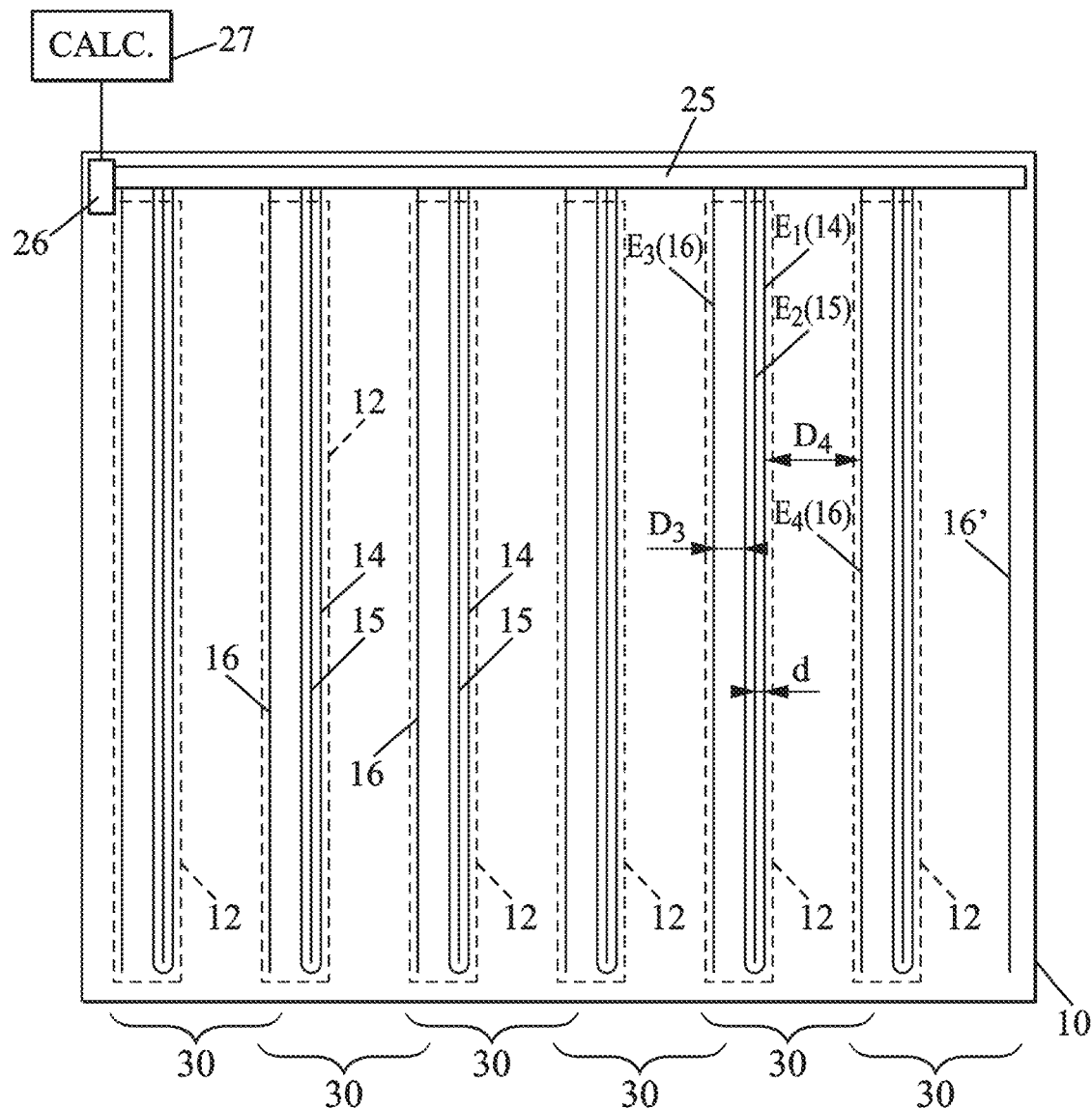
FIG. 1 is a schematic top view of a room having a floor instrumented with capacitive sensors suitable for an exemplary implementation of the present invention.
Figure 2:
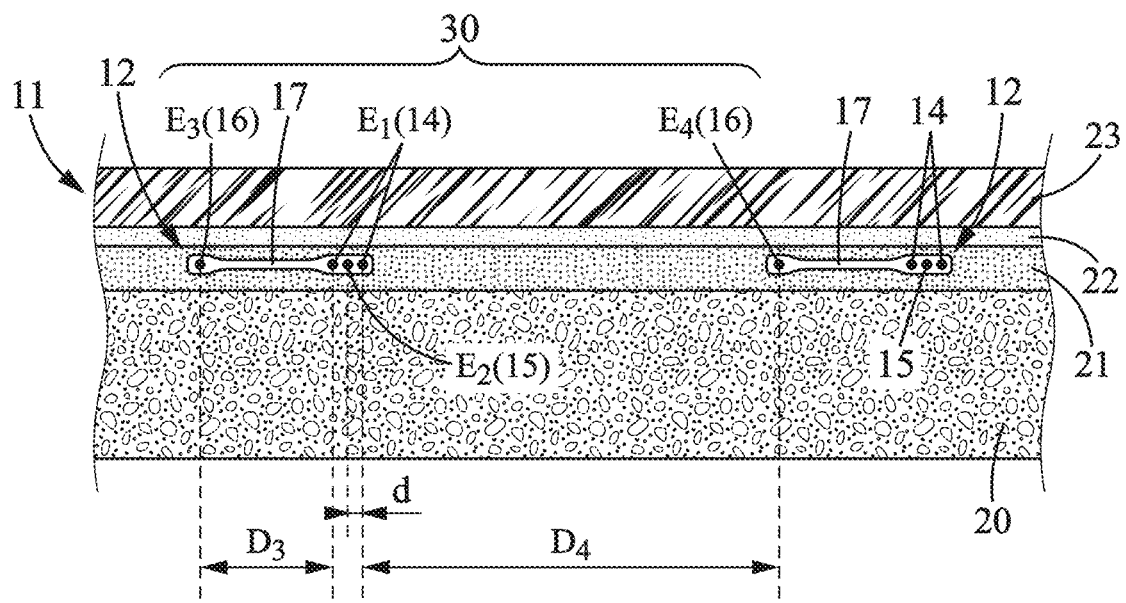
FIG. 2 is a sectional diagram of a portion of the instrumented floor.

The room 10 illustrated by way of example in FIGS. 1 and 2 has an instrumented floor 11 with capacitive sensors of a type similar to those described in WO 2014/053719 A1.

These sensors comprise elongated electrodes, typically metal wires, which extend parallel to each other.

In the example shown, the electrodes are grouped in strips 12 arranged inside the structure of the floor 11. Each strip 12 comprises three electrodes 14, 15, 16 which extend parallel to each other within the same horizontal plane. For convenience of installation and maintenance of the electrodes, the strip 12 may comprise a tape of insulating material 17 within which the electrodes 14-16 are embedded. In this example, each strip 12 includes:

a first wire electrode 14 which consists of two parallel lines joining to form a loop at one end of the strip;

a second wire electrode 15 which extends inside the loop formed by the first electrode 14;

a third wire electrode 16 arranged at a distance $D_3$ from the first electrode 14.

The distance d between the second electrode 15 and each line of the first electrode 14 in a strip 12 is significantly smaller than the distance $D_3$ between the first and third electrodes 14, 16.

As shown in FIG. 2, the strips 12 forming the capacitive sensors are integrated into the structure of the floor 11, for example in a leveling layer 21 covering a screed 20 and on which a layer of adhesive 22 serves to maintain a surface coating 23. Of course, the strips 12 may be arranged in any one of these layers 20-23, or at one of their interfaces.

FIG. 1 also shows a connecting bus 25 which extends perpendicularly to the strips 12, for example along one of the partitions of the room 10, within the floor structure 11 or in a baseboard. The bus 25 has conductors to allow individual and independent connection of each of the sensor electrodes to a power and measurement unit 26 located in or near the room 10.

A computer 27 is connected to the power and measurement unit 26 in order to process the capacitance measurements made. The computer 27, for example a microprocessor, executes programs suitable for processing the measurements as explained below and for controlling the power and measurement unit 26 so that it executes the required measurement sequences.

The strips 12 are arranged parallel to one another in order to cover the area of the room 10 where the ability to detect a person's fall is desired. $D_4$ denotes the distance, perpendicular to the strips, between the first electrode 14 of a strip 12 and the third electrode 16 of the adjacent strip.

In the example implementation of the invention described below, it consists of measurement units 30 each composed of four electrodes $E_1$, $E_2$, $E_3$, $E_4$, namely:

$E_1$: the first electrode 14 of a strip 12;

$E_2$: the second electrode 15 of the same strip 12, separated by a distance d from electrode $E_1$;

$E_3$: the third electrode 16 of the same strip 12, separated by a distance $D_3$ from electrode $E_1$;

$E_4$: the third electrode 16 of the neighboring strip, separated by a distance $D_4$ from electrode $E_1$.

In the rest of this specification, the term "capacitive sensor" is understood to mean a measurement unit 30 of this type, and $C_{ij}$ denotes a capacitance value measured between electrodes i and j of such a sensor ($1 \leq i \leq 4$, $1 \leq j \leq 4$). When i and j designate the same electrode (i=j), the capacitance is measured between the electrode i and ground, or the earth, or any potential serving as a reference for the voltages considered.

For sizing the sensors, one can typically have: d of about 1 to 3 mm, $D_3$ of about 3 to 8 cm, and $D_4$ of about 15 to 30 cm, with electrodes extending across the entire width of the room 10. More generally, it is preferable that the spacing $D_3$ between electrodes $E_1$ and $E_3$ of a sensor 30 be at least three times greater than the spacing $D_4$ between electrodes $E_1$ and $E_4$ of the sensor. As shown in FIG. 1, there may possibly be a single wire electrode 16' at one end of the room 10, for forming electrode $E_4$ of the sensor 30 adjacent to that end.

Each capacitive sensor 30 thus formed is capable of supplying multiple measurement phases under the control of the power and measurement unit 26 and the computer 27. Here, the term "measurement phase" is understood to mean an operation in which one of the electrodes of the sensor 30 is excited by being brought to a given electrical potential, the other electrodes of the sensor are grounded, and the electric charge is measured on one of the electrodes, which may be the excited electrode or another electrode of the sensor 30.

Thus, in a measurement phase $P_{ij}$, the unit 26 grounds all electrodes of the sensor 30 via the bus 25, except electrode $E_i$ to which a reference voltage $V_{ref}$ is applied with respect to ground, and measures the electric charge Q appearing on electrode $E_j$ of the sensor. The capacitance $C_{ij}$ between electrodes $E_i$ and $E_j$ is then: $C_{ij}=Q/V_{ref}$. The presence of a conductive object on the floor in the vicinity of the sensor 30 modifies the environment of the electrodes in question, and therefore the state of charge Q, giving rise to a difference in the capacitance value $C_{ij}$.

It should be noted that the power and measurement unit 26 can simultaneously conduct multiple measurement phases $P_{ij}$ ($1 \leq j \leq 4$) for a given electrode $E_i$ receiving the reference voltage $V_{ref}$.

When i=j, phase $P_{ii}$ makes it possible to measure the specific capacitance of electrode $E_i$, which is possibly also influenced by the presence of a conductive object nearby.

The capacitance measurements can be related to an empty state of the room 10. The "empty" state of the room does not necessarily correspond to a situation where the floor is free of all objects. It is possible that certain objects intended remain indefinitely on the floor are present in this "empty" state, particularly fixed furniture items. However, in the empty state, there are generally no people in the room 10. If the reference capacitance measured between electrodes $E_i$ and $E_j$ of a sensor 30 in the empty room is denoted $C_{ij,0}$, a subsequent measurement of the capacitance $C_{ij}$ can be related to it by taking into account the difference $\Delta C_{ij}=C_{ij}-C_{ij,0}$ when processing the measurements.

Figure 3:
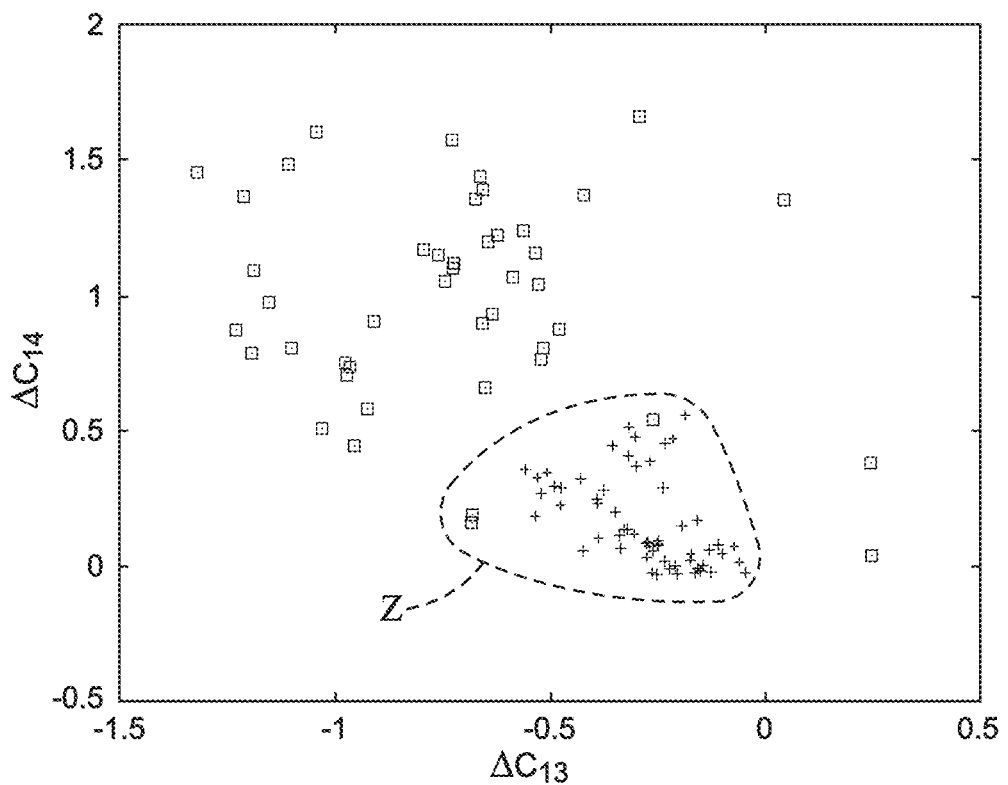
FIG. 3 is a graph illustrating a detection principle that can be used in the context of the invention.

FIG. 3 illustrates measurements performed experimentally in a test room 10 with electrodes configured as described above in a particular case where d=1.27 mm, $D_3$=5 cm, and $D_4$=20 cm. People of different body sizes were asked to position themselves either lying down or in another position (standing, sitting, squatting) on the floor of the room, when making these measurements. On the graph, the measurement points represented by squares (□) concern measurements made when the person was lying down, while the measurement points represented by crosses (+) concern measurements made when the person was in a non-recumbent position.

The capacitance measurements shown in FIG. 3 correspond to the measurement phases $P_{13}$ and $P_{14}$ for one of the capacitive sensors 30. The empty room capacitances $C_{13,0}$ and $C_{14,0}$ were measured beforehand, and the graph shows the differences $\Delta C_{13}=C_{13}-C_{13,0}$ and $\Delta C_{14}=C_{14}-C_{14,0}$ for the different measurement points. The measurement points are then positioned in a coordinate system ($P_{13}$, $P_{14}$) having two measurement axes, one on the abscissa for phase $P_{13}$ where the relative capacitances $\Delta C_{13}=C_{13}-C_{13,0}$ are indicated, and the other on the ordinate for phase $P_{14}$ where the relative capacitances $\Delta C_{14}=C_{14}-C_{14,0}$ are indicated. Along the two axes, the units of FIG. 3 are arbitrary.

Each measurement axis is therefore associated with a pair of electrodes, namely electrodes $E_1$ and $E_3$ for the abscissa axis and electrodes $E_1$ and $E_4$ for the ordinate axis. In this particular case, these two pairs have electrode $E_1$ in common, but this is not necessarily the case.

FIG. 3 shows the tendency of the measurement points to gather in a region Z when the person is not recumbent and to be outside that region Z when the person is lying on the floor. The region Z of the coordinate system in which the measurement points are located in the absence of someone lying on the floor is referred to here as a non-alert region.

In general, the measurement points are farther away from the origin (0, 0) when the person is lying on the floor (□) than when he is not (+).

This observation makes it possible to provide a criterion for distinguishing the cases where a person has fallen and is lying on the floor, from cases where the person (or another person) is simply moving about in the room or is motionless without being stretched out on the floor. The criterion is based on the location of the region Z containing the measurement points that will be filtered out to avoid false detections of people lying on the floor.

FIG. 3 shows that the non-alert region Z can be reliably determined by a series of measurements made in a given room 10 with persons whose posture is known. The region Z can then be identified in the coordinate system ($P_{13}$, $P_{14}$) associated with the two measurement phases considered, for example as has been done by drawing the dashed line in FIG. 3.

Figure 4:
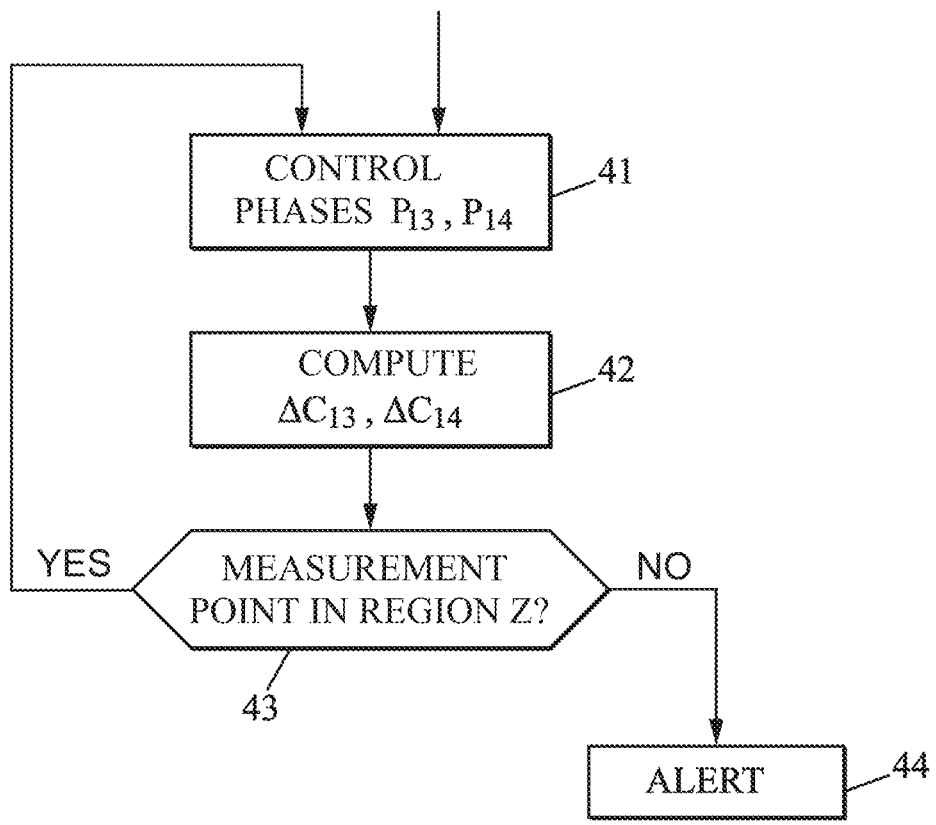
FIG. 4 is a flowchart showing steps of an embodiment of the method according to the invention.

Once the criterion is thus defined, the detection method can be carried out under the control of the computer 27, for example in the manner shown in FIG. 4.

The power and measurement unit 26 is controlled by the computer 27 to periodically execute the measurement phases $P_{13}$ and $P_{14}$ (step 41), and thus collect the two capacitance values $C_{13}$ and $C_{14}$. In step 42, the corresponding measurement point is positioned in the coordinate system ($P_{13}$, $P_{14}$), by calculating the differences $\Delta C_{13}=C_{13}-C_{13,0}$ and $\Delta C_{14}=C_{14}-C_{14,0}$. Then (step 43), the computer 27 evaluates whether the measurement point positioned in this manner is within the non-alert region Z. If such is not the case, an alert is triggered in step 44 so that the person who is presumably lying on the floor can receive assistance. If the measurement point is within region Z, there is no alert and the process returns to periodic monitoring 41.

Even if the non-alert region Z is relatively well-defined in FIG. 3, ambiguous cases may still remain (symbol '□' in region Z or nearby). It is desirable to remove these ambiguities in order to avoid missed detections of recumbent persons and/or false alerts.

One way to do this is to add to the detection criterion using phases $P_{13}$ and $P_{14}$, in other words the pairs of electrodes ($E_1$, $E_3$) and ($E_1$, $E_4$), another detection criterion using different pairs of electrodes. This is illustrated in FIGS. 5 and 6.

Figure 5:
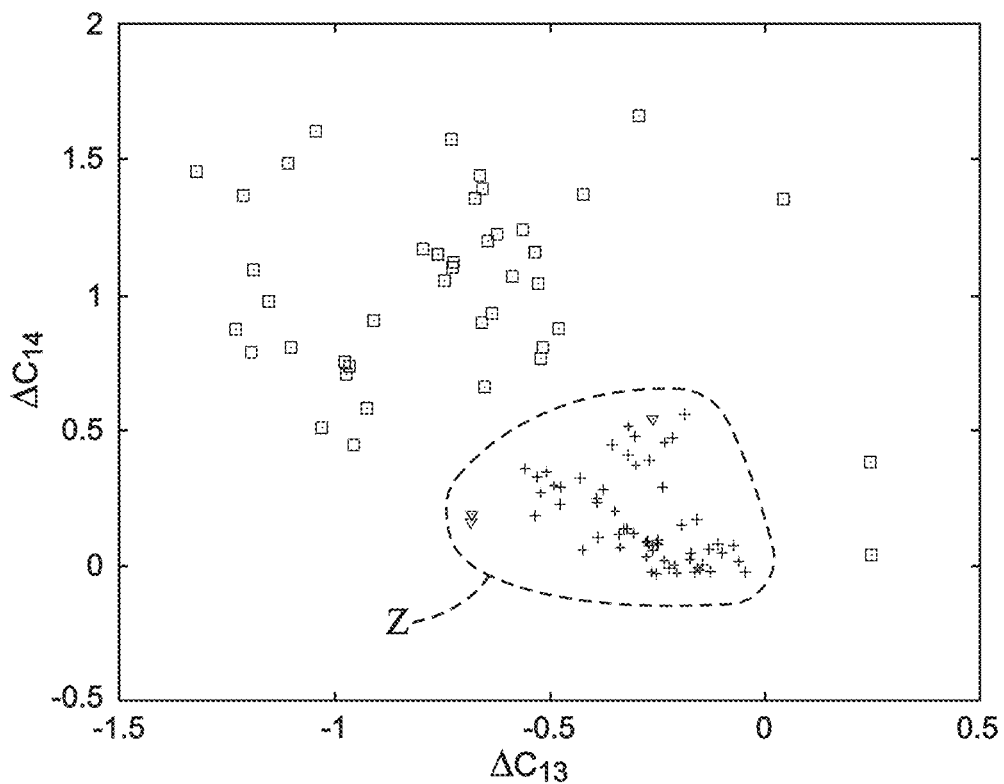
FIGS. 5 and 6 are graphs showing capacitive measurements obtained with different pairs of electrodes and making it possible to remove certain ambiguities in some embodiments of the invention.

FIG. 5 shows the same measurement points as FIG. 3, with the difference that ambiguous cases are represented by triangles (▽). FIG. 6 shows measurement points recorded in phases $P_{11}$ and $P_{33}$. Whenever a person was lying down in the test room 10, capacitance measurements $C_{13}$, $C_{14}$, $C_{11}$ and $C_{33}$ were recorded and the corresponding measurement points □, were positioned in the two coordinate systems ($P_{13}$, $P_{14}$) and ($P_{11}$, $P_{13}$) of FIGS. 5 and 6. Similarly, whenever a person was in another position in the test room 10, capacitance measurements $C_{13}$, $C_{14}$, $C_{11}$ and $C_{33}$ were recorded and the corresponding measurement points '+' were positioned in the two coordinate systems ($P_{13}$, $P_{14}$) and ($P_{11}$, $P_{13}$) of FIGS. 5 and 6. The ambiguous samples ▽, of FIG. 5 were collected in cases where the measurement points in the coordinate system ($P_{11}$, $P_{13}$) of FIG. 6 are also denoted by triangles (▽).

Figure 6:
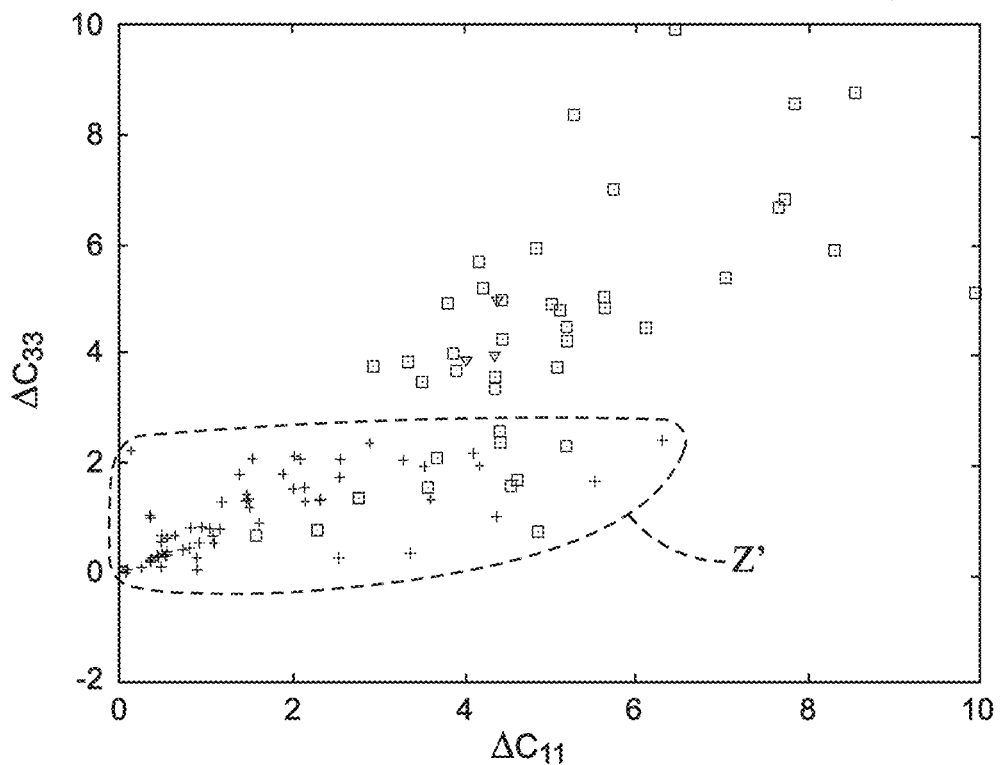

In the example of FIG. 6, the coordinate system is defined by measurement axes associated with pairs of electrodes each composed of the same electrode twice. The capacitances considered are therefore their own capacitances.

In FIG. 6, it is possible, as previously, to trace a non-alert region Z' containing the majority of the measurement points corresponding to a non-recumbent person. It can be seen that the pair of phases $P_{11}$, $P_{33}$ is slightly less relevant than pair $P_{13}$, $P_{14}$, since there are more '□' symbols in (or near) region Z' of FIG. 6 than in (or near) region Z of FIG. 3. However, it is interesting to observe that all the ambiguous samples '▽' of FIG. 5 have their counterparts clearly outside region Z' of FIG. 6.

This observation makes it possible to refine the recumbent/non-recumbent person decision. The detection process can then be in accordance with FIG. 7.

Figure 7:
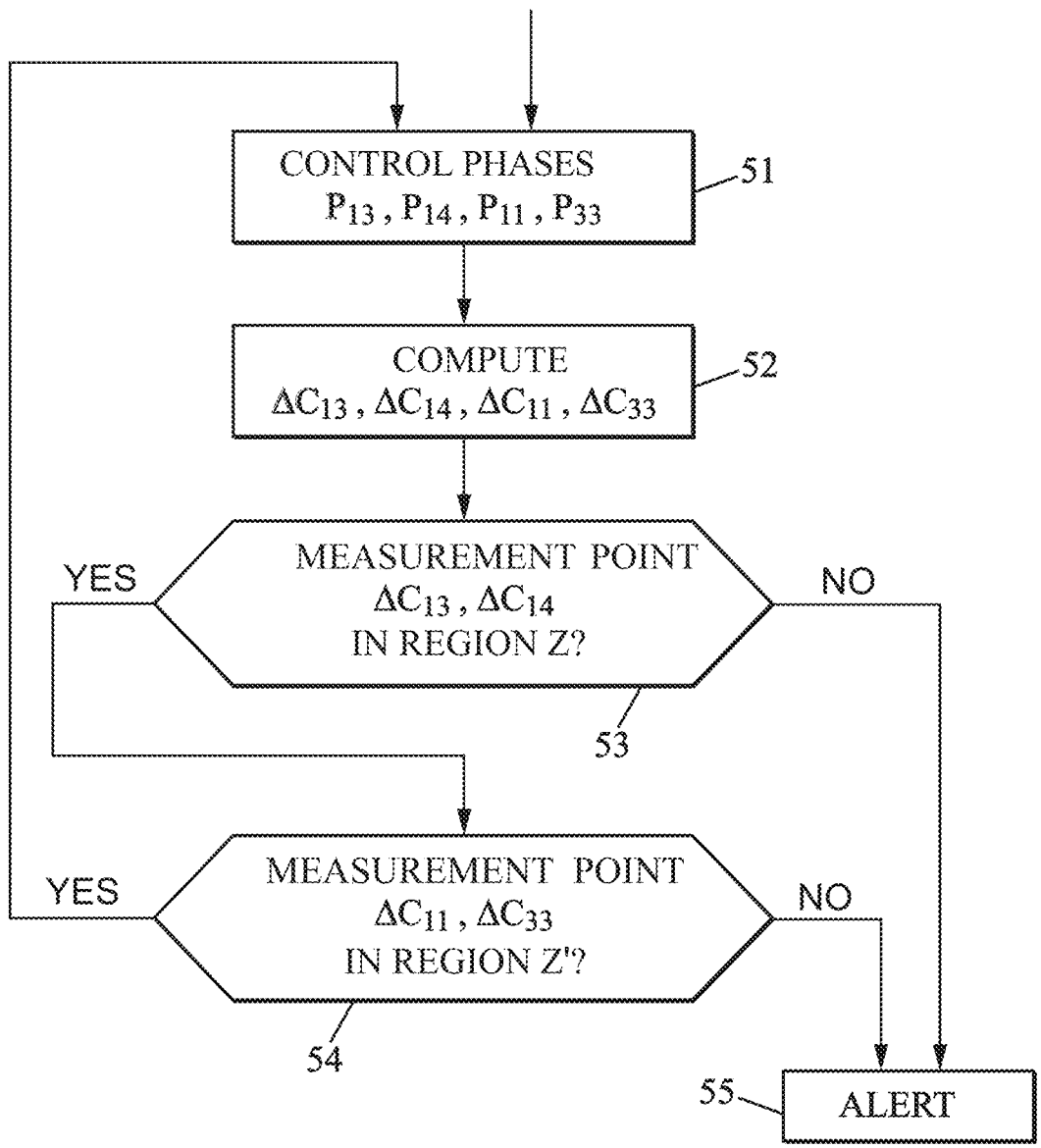
FIG. 7 is a flowchart showing steps of another embodiment of the method according to the invention.

In the example of FIG. 7, the power supply and measurement unit 26 is controlled by the computer 27 to periodically execute the measurement phases $P_{13}$, $P_{14}$, $P_{11}$ and $P_{33}$ (step 51), and thus collect the four capacitance values $C_{13}$, $C_{14}$, $C_{11}$ and $C_{33}$. In step 52, the corresponding measurement points are positioned in the coordinate systems ($P_{13}$, $P_{14}$) and ($P_{11}$, $P_{33}$), by calculating the differences $\Delta C_{13}=C_{13}-C_{13,0}$, $\Delta C_{14}=C_{14}-C_{14,0}$, $\Delta C_{11}=C_{11}-C_{11,0}$, and $\Delta C_{33}=C_{33}-C_{33,0}$. Then (step 53), the computer 27 evaluates whether the first measurement point in coordinate system ($P_{13}$, $P_{14}$) is within the non-alert region Z. If such is not the case, an alert is triggered in step 55. If the first measurement point is within region Z, another test 54 is performed to check whether the second measurement point in coordinate system ($P_{11}$, $P_{33}$) is or is not with the non-alert region Z. If such is not the case, the alert is triggered in step 55. If the two measurement points are in the non-alert regions Z and Z', there is no need to trigger an alert and the process returns to periodic monitoring 51.

The multiplicity of the combinable pairs of electrodes in the capacitive sensor system 30 makes it possible to refine the detection criteria to minimize the occurrences of undetected falls and false alarms. Another way of enriching the detection criterion is to search for the non-alert region Z in an N-dimensional space where N>2. Thus, the region Z no longer corresponds only to a surface on a two-dimensional graph such as those of FIGS. 3, 5, and 6, but, for example, to a volume in a space where N=3 dimensions.

Depending on the body type or size of the person, there may be more or less significant variations of the signal in the measurement phases taken into account in a given coordinate system. However, the non-alert region Z remains similar in a given coordinate system R for the various persons considered.

This can vary depending on the environment in which the capacitive sensor or sensors is located, in particular the depth at which the electrodes of the sensor or sensors are located, or according to the geometry of the sensor or sensors, in particular the length of the electrodes. In general, the further the electrodes are from the person to be detected, the weaker the signals are, so that the region Z contracts towards the origin (0, 0) of the coordinate system R.

This phenomenon is illustrated by FIG. 8, which again shows measurement points obtained in the coordinate system associated with the pairs of electrodes ($E_1$, $E_3$) and ($E_1$, $E_4$). Measurement points denoted '□' and '+' were collected respectively for people lying down and not lying down, while the room had a first type of floor covering. As before, it is possible to locate a non-alert region Z1 where the recorded measurement points collect, with a person in a non-recumbent position. Similarly, the measurement points denoted '◇' and 'x' in FIG. 8 were respectively collected with people in recumbent and non-recumbent positions, while the room had another type of floor covering which was less thick. Here too, it is possible to locate a non-alert region Z2 where the recorded measurement points collect, with a person in a non-recumbent position. Region Z1 is less extensive and is closer to the origin of the coordinate system than region Z2.

Several means can be used to make the detection less dependent on the geometry of the room 10 where the sensors are installed, as well as on the nature of the floor and its covering.

For example and in a non-limiting manner, it is possible to normalize the measurements between themselves, to use a calibration measurement to apply a transformation in the coordinate system used, or to conduct initial or continuous learning of the non-alert region after installation of the sensors in a new room.

Normalization of measurements is a solution that gives good results, especially when the flooring varies. It consists of normalizing the capacitance measurements in order to provide the coordinates of the measurement points in the coordinate system, relative to a reference capacitance measurement between the two electrodes of a pair associated with one of the measurement axes of the coordinate system when the floor is in the empty state. This normalization occurs, for example, in step 42 of FIG. 4 or in step 52 of FIG. 7.

The formula used for normalization can be optimized for the application considered. It has been found that a good normalization method consists of calculating the coordinates of the measurement points in coordinate system ($P_{13}$, $P_{14}$) by dividing by the square of the empty state signal of phase $P_{13}$, in other words to give the measurement point the coordinates $\Delta C_{13}/(C_{13,0})^2$ and $\Delta C_{14}/(C_{13,0})^2$.

Figure 8:
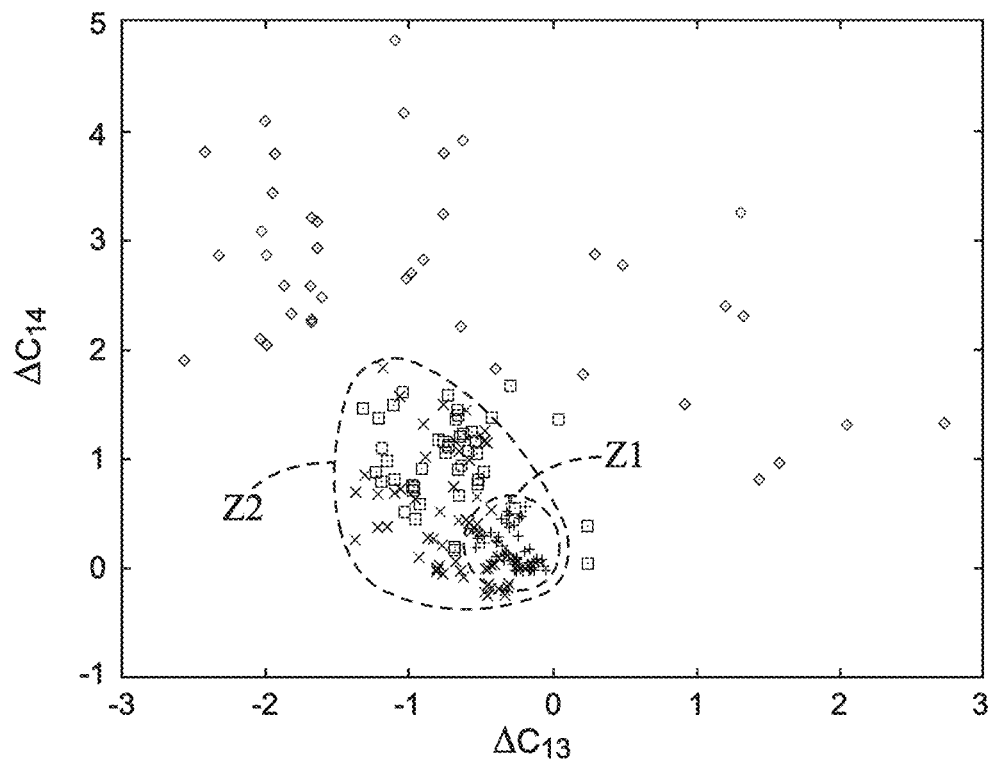
FIG. 8 is a graph showing capacitive measurements obtained with electrode pairs integrated differently into the instrumented floor.
Figure 9:
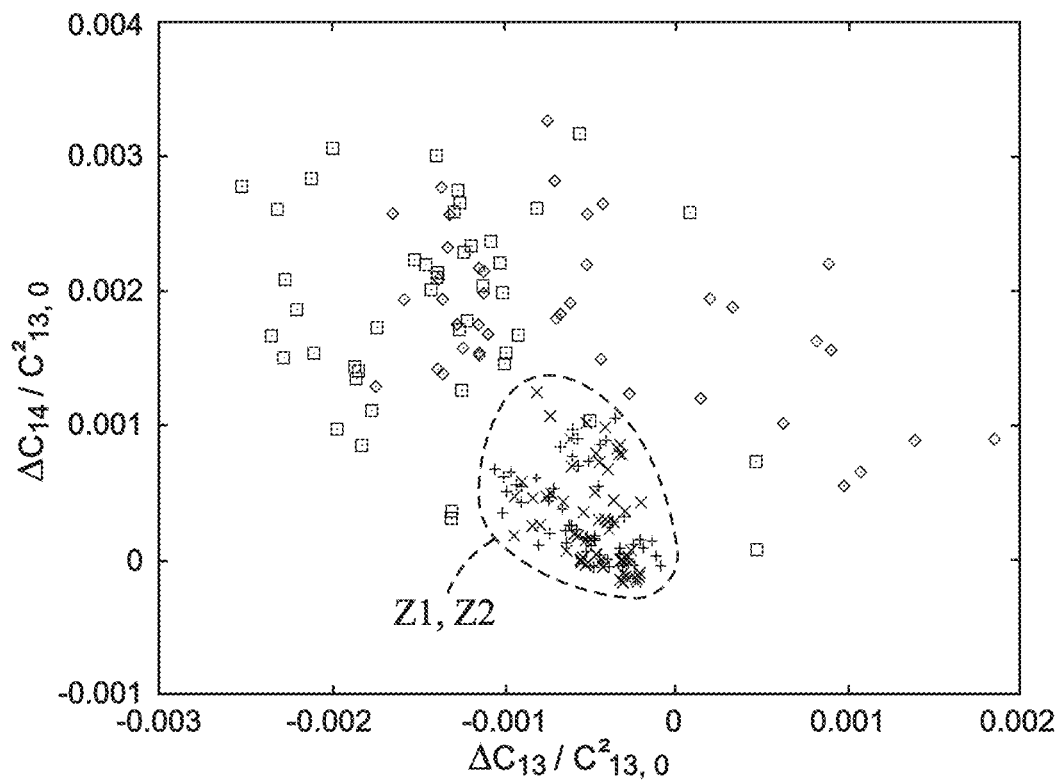
FIG. 9 is a graph similar to that of FIG. 8, but taking into account a normalization of the measurements.

FIG. 9 shows the measurement points of FIG. 8 after normalization in this form. One can see that regions Z1 and Z2 become almost merged. This means that normalization has made it possible to overcome differences due to floor coverings.

The use of one or more calibration objects makes it possible to carry out measurements once the system has been installed in a new room 10 and to find a transformation to move the corresponding point or points in the reference frame concerned, for example ($P_{13}$, $P_{14}$). It is thus possible to bring the measurement points to a position in the coordinate system corresponding to a reference room 10R.

The calculated transformation makes it possible to virtually transform the new room 10 where the sensors are installed into a reference room for which the non-alert region Z is well-defined.

An appropriate transformation consists of applying a homothety then a rotation to the coordinates of the measurement point in the coordinate system concerned.

This transformation can be mathematically written in the form XT=XN×XR/XE, where:
- the complex number XN has its real and imaginary parts respectively equal to the coordinates of a measurement point obtained in the new room 10;
- the complex number XE has its real and imaginary parts respectively equal to the coordinates of a measurement point obtained in the new room 10 with the calibration object (for example a bucket of water);
- the complex number XR has its real and imaginary parts respectively equal to the coordinates of a measurement point obtained in the reference room 10R with the calibration object;

the complex number XT has its real and imaginary parts respectively equal to the coordinates of the transformed measurement point.

Figure 10:
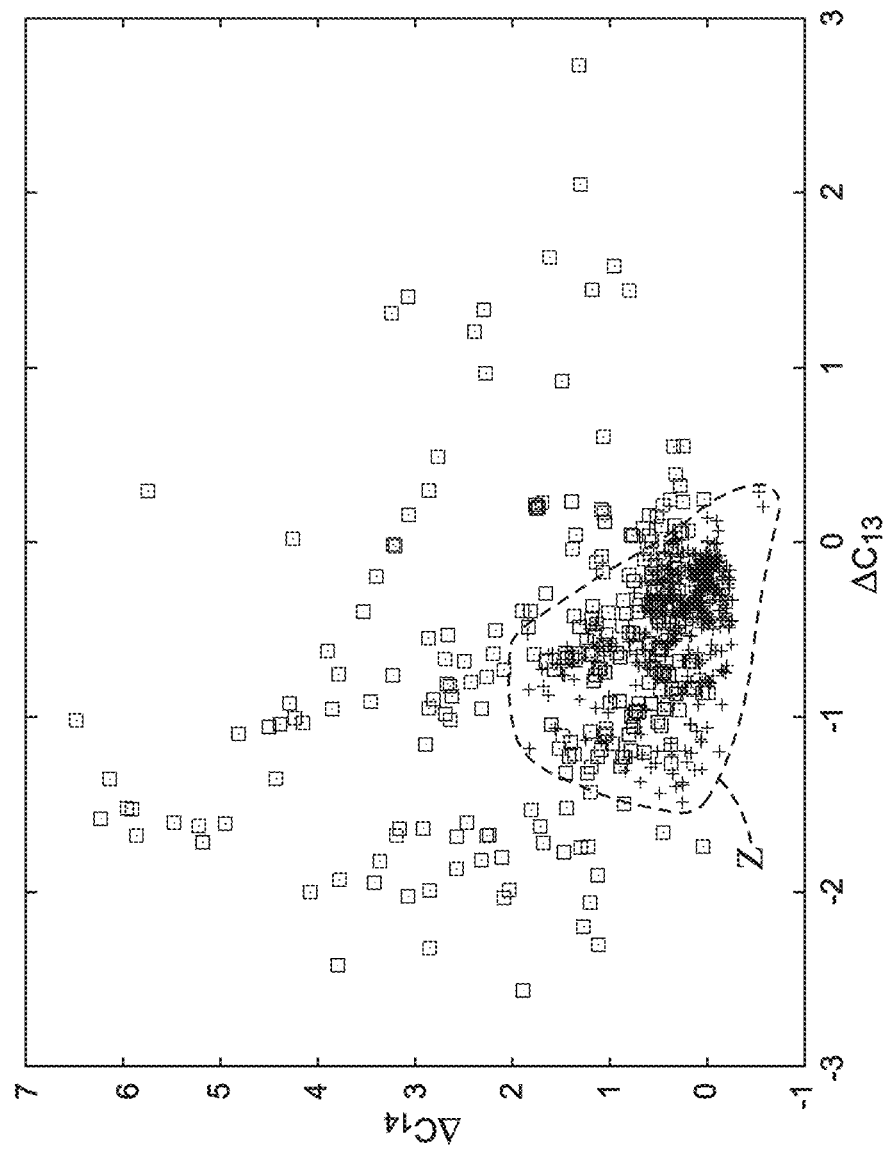
FIGS. 10 and 11 are graphs representing capacitive measurements before and after the application of a mathematical transformation.
Figure 11:
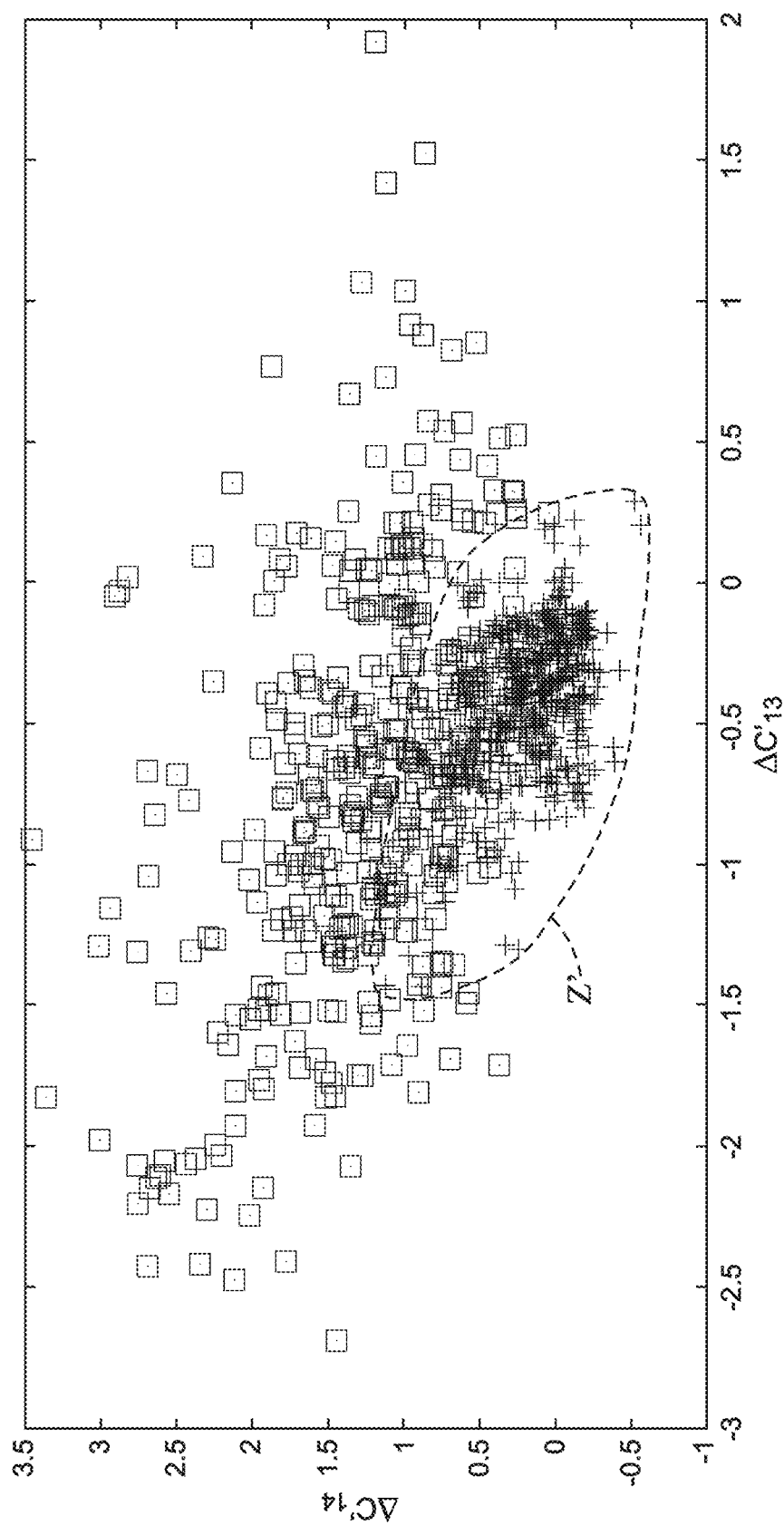

Such a calculation can be carried out in step 42 of FIG. 4 or in step 52 of FIG. 7. Other forms of transformation are also possible, to the extent that they enable moving the non-alert region Z of a new room 10 (FIG. 10) to a given reference region Z' in the coordinate system concerned (FIG. 11).

Learning is another possibility for directly determining the non-alert region Z in the coordinate system concerned, once the room is equipped with capacitive sensors. An initial learning process is relatively time-consuming since it requires a sufficiently abundant sampling to locate the contours of the region Z with accuracy.

An alternative solution is to conduct continuous learning, meaning that the computer 27 uses continuously measured data in order to determine and refine the contours of the non-alert region Z.

Knowing that the region Z is relatively small and corresponds to very frequent daily situations, the contours of this region Z are quickly identified, the detection of a person on the floor then corresponding to the moment when the measurement point in the coordinate system concerned clearly differs from the points already measured.

In a non-limiting example, the detection of a significant difference consists of (i) determining the smallest distance, in the coordinate system concerned, between the current measurement point and the various measurement points previously determined, (ii) comparing this smallest distance to the average distance between the points already measured. If the smallest distance exceeds the average distance multiplied by a factor $\alpha$ (for example, $\alpha=3$), then the measurement point is considered to be outside region Z and an alert is triggered. Otherwise, the measurement point is considered to be within region Z.

A detection algorithm of this last type requires a phase during which people in the new room 10 are assumed not to be on the floor, so that there are enough sampled measurement points to draw a reliable contour of the non-alert region Z.

An advantageous mode for installing the detection system includes an initialization of the non-alert region Z in the chosen coordinate system, for example ($P_{13}$, $P_{14}$), or in the chosen coordinate systems if there are several, using the calibration object technique described above, then continuous learning of the region Z as just mentioned. This initialization allows the system to be operable immediately. If the new room evolves due to aging or to the installation of different floor coverings, for example a carpet, the system adapts and remains operational.

The embodiments described above are a simple illustration of the invention. Various modifications may be made without departing from the scope of the invention as appearing from the appended claims.

A detection method, for example such as the one illustrated in FIG. 4 or 7, may be implemented for each of the capacitive sensors 30 shown in FIG. 1 or in very diverse configurations of such sensors. It is also possible to correlate capacitive measurements made by different sensors, in order to improve the decision making.

The invention claimed is:

1. A method for detecting people on a floor, at least three electrodes being integrated into the floor and respective measurement axes being associated with multiple pairs of electrodes integrated into the floor, each measurement axis representing a function of a capacitance between the two electrodes of the pair of electrodes associated with said measurement axis, the method comprising:

measuring, for each pair of electrodes, a capacitance between the two electrodes of the pair;

positioning a measurement point in a coordinate system defined by N of the measurement axes at coordinates provided by the capacitances measured for the pairs of electrodes respectively associated with the N measurement axes, where N is a number greater than 1; and detecting whether a person is lying on the floor according to a detection criterion function of the position of the measurement point in the coordinate system.

2. The method according to claim 1, wherein N=2.

3. The method according to claim 1, wherein, for a first of the N measurement axes, the electrodes of the associated pair are substantially parallel and with a first spacing between them, and for a second of the N measurement axes, the electrodes of the associated pair are substantially parallel and with a second spacing between them, and wherein the electrodes of the pairs associated with the first and second measurement axes are located in the same horizontal plane.

4. The method according to claim 3, wherein the second spacing is at least three times larger than the first spacing.

5. The method according to claim 3, wherein the first spacing is comprised between 3 and 8 centimeters, and the second spacing is comprised between 15 and 30 centimeters.

6. The method according to claim 1, wherein a plurality of measurement points are positioned in a plurality of respective coordinate systems defined by different measurement axes at coordinates provided by the capacitances measured for the pairs of electrodes respectively associated with the different measurement axes, and wherein the detecting whether a person is lying on the floor is performed according to plural detection criteria which are function of the positions of the measurement points in the respective coordinate systems.

7. The method according to claim 6, wherein one of the coordinate systems is defined by measurement axes including at least one measurement axis associated with a pair of electrodes consisting of the same electrode twice.

8. The method according to claim 1, further comprising:

for each measurement axis, a preliminary measurement, while the floor is unoccupied, of a reference capacitance between the two electrodes of the pair associated with said measurement axis, wherein the measurement point positioned in a coordinate system has a coordinate, along a measurement axis, provided by a difference between the capacitance measured for the pair of electrodes associated with said measurement axis and the reference capacitance previously measured for said measurement axis.

9. The method according to claim 8, wherein the differences in capacitance are normalized in order to provide the coordinates of the measurement points in a coordinate system, the difference for each measurement axis being normalized relative to the reference capacitance previously measured for one of the N measurement axes.

10. The method according to claim 9, wherein the normalization consists of dividing the capacitance differences by the square of the reference capacitance previously measured for one of the N measurement axes, in order to obtain the coordinates of the measurement points in the coordinate system.

11. The method according to claim 1, further comprising:
a determination of a non-alert region in said coordinate system, the non-alert region containing the measurement points observed when no person is lying on the floor.

12. The method according to claim 11, wherein the detection criterion comprises an evaluation of the position of a current measurement point relative to the non-alert region.

13. The method according to claim 11, wherein the determination of the non-alert region comprises a learning process carried out after integration of the electrodes into the floor, in order to estimate a contour of the non-alert region.

14. The method according to claim 13, wherein the learning process comprises the addition, to the non-alert region, of measurement points for which the smallest distance to the measurement points previously added to the non-alert region does not exceed a times the average distance between the measurement points previously added to the non-alert region, where a is a predefined coefficient.

15. The method according to claim 14, wherein $\alpha=3$.

16. The method according to claim 11, wherein the positioning of the measurement point in the coordinate system defined by N measurement axes comprises determining a first measurement point and then applying a mathematical transformation to the first measurement point, the mathematical transformation being able to move the non-alert region defined for a room containing the floor where the electrodes are integrated, to a non-alert region defined for a reference room.

17. The method according to claim 16, further comprising:
for each measurement axis, a preliminary measurement, while the floor is unoccupied, of a reference capacitance between the two electrodes of the pair associated with said measurement axis,
wherein the mathematical transformation comprises a homothety and/or a rotation applied to the first measurement point having, along each measurement axis, a coordinate provided by a difference between the measured capacitance for the pair of electrodes associated with said measurement axis and the reference capacitance previously measured for said measurement axis.

18. The method according to claim 16, wherein the mathematical transformation is determined from measurements made in the reference room and in the room containing the floor where the electrodes are integrated, using a calibration object placed on the floor.

19. A system for detecting people on a floor, comprising:
at least three electrodes integrated into the floor;
a unit for powering the electrodes and measuring capacitances provided between the electrodes, wherein respective measurement axes are associated with multiple pairs of electrodes integrated into the floor, each measurement axis representing a function of a capacitance between the two electrodes of the pair of electrodes associated with said measurement axis; and
a computer for controlling the power and measurement unit and detecting whether a person is lying on the floor, the computer being configured to:
measure for each pair of electrodes, a capacitance between the two electrodes of the pair,
position a measurement point in a coordinate system defined by N of the measurement axes at coordinates provided by the capacitances measured for the pairs of electrodes respectively associated with the N measurement axes, where N is a number greater than 1, and
detect whether a person is lying on the floor according to a detection criterion function of the position of the measurement point in the coordinate system.

* * * * *